United States Patent [19]
Petree

[11] 3,978,405
[45] Aug. 31, 1976

[54] DAMAGE THRESHOLDS OF P-N JUNCTION DEVICES BY A CURRENT PULSE METHOD

[75] Inventor: Marcella C. Petree, Silver Spring, Md.

[73] Assignee: The United States of America as represented by the Secretary of the Navy, Washington, D.C.

[22] Filed: Feb. 7, 1975

[21] Appl. No.: 547,834

[52] U.S. Cl. .......................... 324/158 T; 324/158 D
[51] Int. Cl.² ......................................... G01R 31/22
[58] Field of Search ......... 324/158 T, 158 D, 158 R

[56] References Cited
OTHER PUBLICATIONS

Schiff, P.; "Preventing Second Breakdown . . . ;" Electronics; June 15, 1964; pp. 66–74.

Primary Examiner—R. V. Rolinec
Assistant Examiner—Ernest F. Karlsen
Attorney, Agent, or Firm—R. S. Sciascia; A. L. Branning; W. W. Cochran

[57] ABSTRACT

An improvement of the Wunsch test method for measuring pulsed-power failure thresholds of bipolar transistors and p-n junction diodes using short-pulse testing with pulse durations of 100 nanoseconds or less. A square pulse of reverse current is used to damage the p-n junction of interest, and the absorbed power is computed from oscilloscope traces of voltage and current. A constant-current pulse is used rather than the constant power pulse of the Wunsch test method, thereby limiting the damage done to the device and permitting a wide range of device parameter to be observed. The degree of device degradation is utilized to distinguish between true and false measurements of thresholddamage input-power and also to ensure that the individual failure levels of specimens of a sample actually are threshold failure levels rather than overkill levels, in order that the average of these levels represents, approximately, a 50% probability of failure for the sample. The current-pulse method simplifies the pulse-test procedures and produces damage threshold data which is many times more accurate than that which has been produced by previous methods.

8 Claims, 4 Drawing Figures

DAMAGE THRESHOLDS OF P-N JUNCTION DEVICES BY A CURRENT PULSE METHOD

BACKGROUND OF THE INVENTION

The present invention relates generally to methods for testing damage levels of semiconductor devices and more particularly to methods for measuring average power levels required for producing failures in p-n junctions of transistors. Various methods have been used in the prior art to predict the failure performance of semiconductor devices. Among those methods, the Wunsch test (*Determination Of Threshold Failure Levels of Semiconductor Diodes And Transistors Due To Pulse Voltages*, D. C. Wunsch and R. R. Bell, IEEE Transactions on Nuclear Science, Volume NS-15, page 244, December, 1968; *Semiconductor Device Damage In An EMP Environment*, D. C. Wunsch, Conference Proceedings, Component Degradation From Transient Inputs, Electromagnetic Effects Laboratory, U.S. Army Mobility Equipment Research and Development Center, 28–29 April 1970) has been the most successful for measuring the pulsed power failure thresholds for transistors. This information is essential to the selection of a semiconductor device to protect a circuit from extremely high power transient electromagnetic pulses (EMP) such as those produced by a nuclear blast. The well known method of protecting the circuit is to place a diode between the antenna of, for example, a receiver circuit, and ground potential in a reversed biased configuration. Incoming pulses which exceed the reverse bias breakdown voltage are therefore shunted to ground potential thereby protecting the elements of the circuit from burnout. However, to insure that the diode does not become shorted out itself by a pulse that exceeds its power handling capabilities and thereby shunting all incoming signals to ground potential so that the receiver is inoperable after the EMP has passed, a method is needed to nondestructively determine the power handling capability of each diode to be used. Tests to determine power handling capabilities of diodes are also applicable to p-n junctions of other semiconductor devices, such as transistors to predict their ability to handle high power EMP's within the circuit itself or as actual protection devices.

The Wunsch method is an attempt to measure the pulsed power failure threshold of both bipolar transistors and diodes. Wunsch utilizes a constant power pulse of reverse polarity and very short duration i.e., 100 nano-seconds or less, across a p-n junction of a semiconductor device. From the oscilloscope traces of voltage and current, the power absorbed by the p-n junction can be determined. By pulsing the device until failure occurs, the total power required to cause failure can be determined. If the area of p-n junction can then be determined, the power per unit area can be calculated so that the power capabilities of semiconductor devices which have not been subjected to tests can be calculated by knowing their p-n junction area.

However, the results of the Wunsch test do not have significant correlation to the expected theoretical results. According to theory, the maximum power per unit area before failure (P/A) is a function of both the Wunsch damage factor K and time $t$. In particular, $$P/A = Kt^{-1/2}$$

The Wunsch damage factor $K$ can be expressed as follows:

$$K = \sqrt{\pi C_p \bar{k} \rho} (T_m - T_i)$$

where
- $C_p$ = specific heat for semiconductor material (i.e. silicon)
- $k$ = Thermal conductivity for semiconductor material (i.e. silicon)
- $\rho$ = density of silicon
- $T_{max}$ = temperature at the p-n junction when burnout begins
- $T_i$ = Initial temperature of the p-n junction.

The measured results, however, vary significantly from the theoretical results which is due to a phenomenon referred to as second breakdown a condition differing from the primary breakdown (i.e., avalanche breakdown) — the sustaining condition of a semiconductor device — in that second breakdown is an irreversible failure condition. During second breakdown, the p-n junction does not act as a single unit to dissipate power. Normally, when a junction is in primary breakdown or avalanche condition there is an avalanche of charge carriers across the junction. During second breakdown, small sections (hot spots or current constriction points) of the p-n junction switch from an avalanche generating state to a thermal generating state and thereafter carry the bulk of the current across the junction. Therefore, power measurements made after second breakdown has occurred are useless in determining the power capabilities of the p-n junction since the junction has ceased to act as an integrated power dissipating unit because it has been at least partially damaged by the creation of one or more current constriction sites.

Studies by Sunshine and Lampert (*Second-Breakdown Phenomena In Avalanching Silicon-On-Sapphire Diodes*, R. A. Sunshine and M. A. Lampert, IEEE Transactions On Electron Devices, Volume ED-19, page 873, July, 1972) have confirmed the above theories pertaining to second breakdown. Sunshine and Lampert have studied second breakdown in silicon-on-sapphire p-n junctions under steady-state and pulse conditions. Their experimental techniques made it possible to observe local temperature rises in the interior of their diodes. By means of stroboscopic photographs of the temporal and spatial development of heated regions in operating diodes, they demonstrated the following facts about heat flow and the redistribution of current flow when their diodes were pulsed into second breakdown. During the delay time from the beginning of a square pulse of current to the time that second breakdown began, the avalanche current was more or less uniformly distributed across the junction plane and the junction space charge region heated rather uniformly. Second breakdown occurred when the thermally generated leakage current became large enough at some localized region of the junction to quench the avalanche there. The current then rapidly constricted and flowed through the hot spot. The power density at the constriction site was much higher than it had been during the delay time, and under some conditions a narrow, highly conducting hot filament propagated from the hot spot into the more resistive side of the diode. The formation of the hot filament usually resulted in device degradation and often in catastrophic failure. The filament formed and penetrated completely through the resistive region only when the junction temperature at the constriction site was much higher than the intrinsic temperature of the resistive material. When the constriction temperature was less than the intrinsic temperature, the hot region remained localized at the junction.

In the light of the Sunshine-Lampert studies, second breakdown is clearly a necessary anterior condition for device damage, since it indicates that reverse current in a p-n junction has switched from an avalanche to a thermal generating mechanism. Whenever second breakdown is observed, the power level and delay time preceding the breakdown are valid indicators of the failure threshold. Although the voltage drop occurs at second breakdown and can be readily seen in long-pulse testing (pulse duration greater than 100 nanoseconds), such is not always the case in short-pulse testing. In some short-pulse test cases the current apparently does not have time to constrict into a single channel, and the diode voltage declines gradually, if at all. In other cases, the second breakdown occurs just after the application of the test pulse but the fast rise time of the turn-on spike (caused by the inductance of the electrical connectors and circuit component leads) obscures the second breakdown voltage drop. The input power level computed from the remainder of such a voltage waveform is much lower than the true threshold failure level, and such data should be discarded.

The Wunsch test has added further to the miscalculation of data by use of a constant power pulse. When second breakdown occurs the resistance of the device falls thereby normally causing the voltage across the junction to fall to a lower level. To keep the power constant, it is necessary to increase the power across the junction to keep the voltage constant when second breakdown occurs thereby, in most cases, causing excessive, permanent damage to the device.

The total area under the constant power pulse curve is therefore indicative of the energy required to damage the device. The problem, however, is that the damage done to the semiconductor device under the Wunsch method is invariably catastrophic whether the applied power level was just at the threshold or considerably above it, and as a result, the quantum of applied power to cause threshold damage cannot be measured from the Wunsch method curves.

SUMMARY OF THE INVENTION

The present inventive method overcomes the disadvantages and limitations of the prior art by providing an improved method for measuring damage thresholds for p-n junction devices by use of a constant current pulse method. Unlike the Wunsch test method which uses a constant power pulse, the present invention uses a constant current pulse so that when second breakdown and a concomitant reduction in the resistance of the device begins the power applied to the device junction is decreased. The power applied up to the point of second breakdown is constant and easily determined from the oscilloscope traces of voltage and current. In addition, the power is clearly more indicative of the power handling capabilities of the device's p-n junction.

It is therefore an object of the present invention to provide an improved method for determining the damage threshold of a semiconductor p-n junction.

It is also an object of the present invention to provide a more reliable method for determining the damage threshold of a semiconductor p-n junction.

Another object of the present device is to provide a destructive method for determining the damage threshold of a semiconductor junction.

Yet another object of the present invention is to provide a non-destructive method for predicting the damage threshold of an untested semiconductor junction.

Still yet another object of the present invention is to provide a destructive short duration pulse testing method that accommodates an accurate determination of the energy required to reach the damage threshold of a semiconductor junction.

Other objects, advantages and novel features of the invention will become apparent from the following detailed description of the invention when considered in conjunction with the accompanying drawings wherein:

DETAILED DESCRIPTION OF THE PREFERRED EMBODIMENT

Figure 1A:
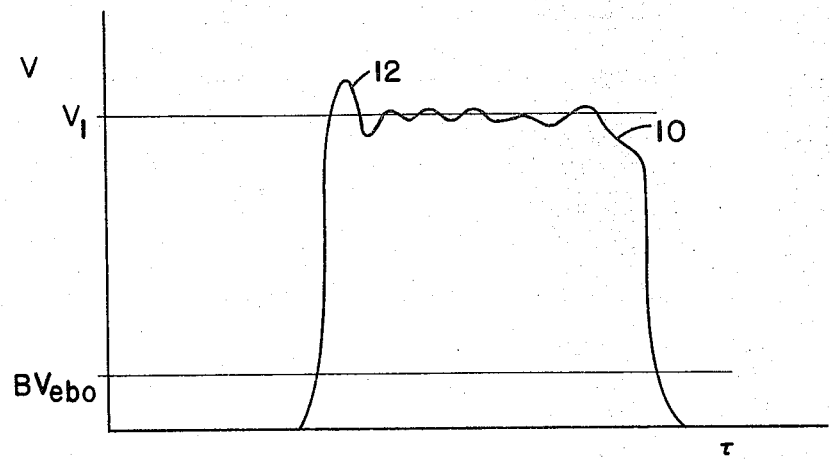
FIG. 1A discloses a typical voltage waveform of an emitter junction subjected to threshold damage.
Figure 1B:
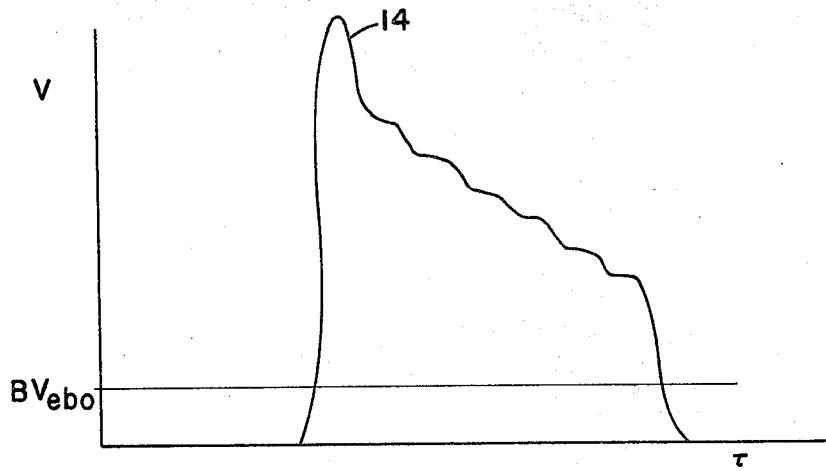
FIG. 1B discloses a typical waveform of an emitter junction subjected to catastrophic damage wherein second breakdown occurs in the initial pulse.

FIGS. 1A and 1B show two voltage waveforms that represent true and false failure threshold damage data. Both waveforms show the voltage developed across the base-emitter terminals of a transistor when the emitter is damaged by a square pulse of reverse current. On each trace, the DC breakdown voltage (the voltage at which avalanche breakdown occurs) is shown to scale by the line marked $BV_{ebo}$. The pulse voltage is five or six times larger than the emitter breakdown voltage due to space charge resistance and bulk series resistance. The pre-damage current density of the junction of the semiconductor subjected to the short pulse is between approximately 1 and $2 \times 10^5$ amperes per square centimeter. After second breakdown and constriction of the current, the current density rose to between approximately 1 and $2 \times 10^7$ amperes per square centimeter. The trace in FIG. 1A is useable in calculating threshold damage power levels. Second breakdown occurred near the end of the pulse at the point marked 10 and the voltage level $V_1$ that caused second breakdown is not obscured by the turn-on spike 12. All transistors whose emitter junctions produced this type of voltage waveform were only moderately damaged, having reduced common-emitter gain, $\beta/\beta_o$, between 0.25 and 0.85. An unusuable voltage waveform is shown in FIG. 1B. Second breakdown occurred during the rise of turn-on spike 14 and the remainder of the pulse represents continuing damage occurring at an input power level that is lower than the threshold level. Transistors whose emitter junctions produced this type of voltage waveform were severely damaged, and their $\beta/\beta_o$ approached zero.

The interpretation of voltage waveforms when the transition into second breakdown is not clearly visible as a voltage step, such as is shown in FIG. 1B, can best be made when a constant-current rather than a constant power pulse is used. Limiting the current after second breakdown takes place limits the damage done to the device and permits a wider range of device parameter degradation as shown by a damage indicator such as a ratio proportional to the change in common emitter gain, to be observed. By contrast, when a constant-voltage or an approximately constant-power pulse is used, the current increases when damage begins and far more than threshold damage is done. As such damage is usually catastrophic whether the applied power level was just at the threshold for damage or considerably above it, any information obtained by a post-damage examination of the device lacks correspondence to the amount of power required for threshold damage of the device, and is meaningless.

Figure 2:
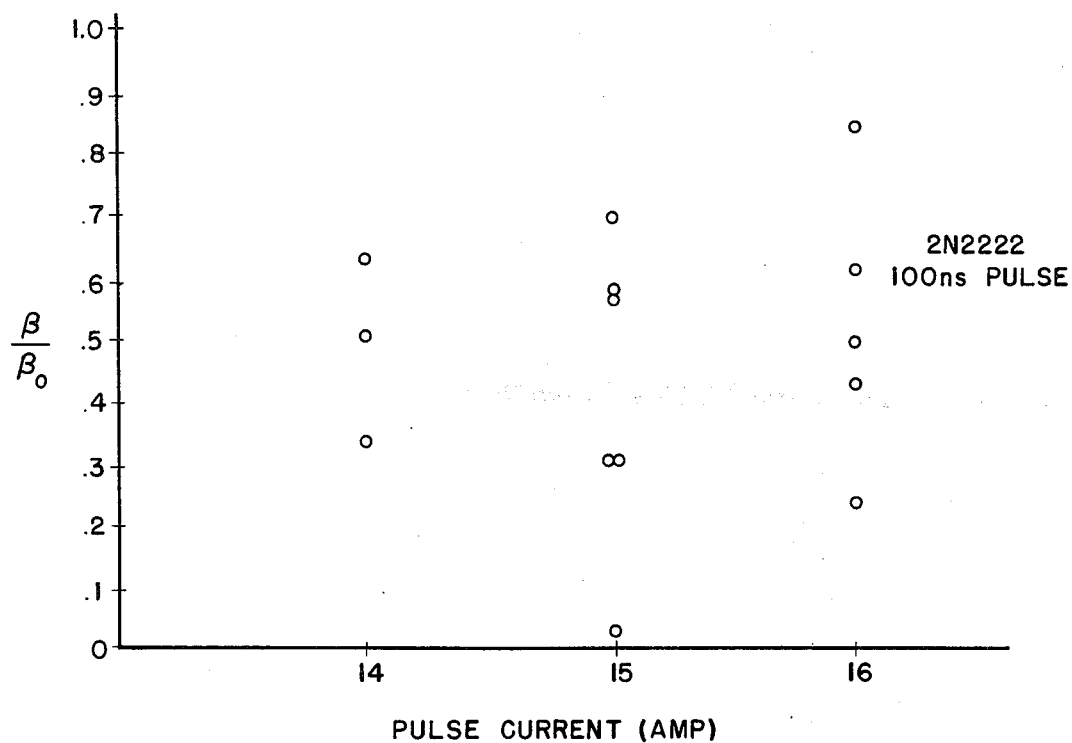
FIG. 2 is a plot of emitter gain versus pulse current for a number of 2N2222 transistor test devices in response to a 100 nanosecond pulse of reverse polarity.

FIG. 2 shows that reduced common emitter gain, $\beta/\beta_o$, plotted against current for individual 2N2222 transistors. Each transistor was tested by means of a 100 nanosecond constant-current pulse having a half-nanosecond rise time in order to approximate the risetime, duration, and order of magnitude of the power of the electromagnetic pulse induced by a nuclear blast. The base-emitter terminals received a reverse-polarity pulse and each transistor was pulsed only once. The three current levels used in the test were selected after a preliminary test in which one transistor was step stressed by constant-current pulses. All but one of the 14 transistors produced usable data for the purpose of establishing an average threshold-damage power level for a 100 nanosecond pulse. The one exception showed $\beta/\beta_o$ reduced to zero by a 15-ampere pulse.

Figure 3:
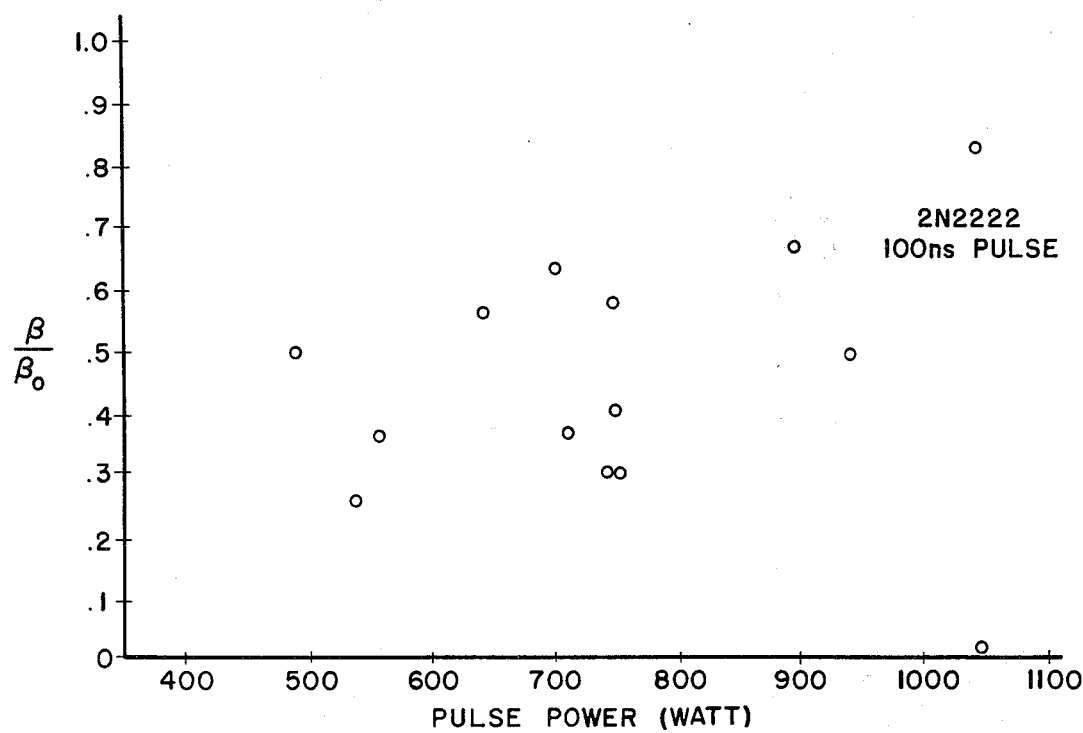
FIG. 3 is a plot of emitter gain versus pulse power in watts for a number of 2N2222 transistor test devices in response to a 100 nanosecond pulse of reverse polarity.

FIG. 3 shows the damage indicator, $\beta/\beta_o$, plotted against pulse power for the same 14 transistors of FIG. 2. Thirteen of the data points are scattered about the line $\beta/\beta_o = 0.50$ and lie between the limits of 0.25 and 0.85, indicating moderate damage. The pulse power levels that produced damage in this range of $\beta/\beta_o$ are all usable as threshold damage levels, since it previously verified that moderate gain degradation in these transistors correlated with an emitter junction voltage waveform that showed second breakdown occurring at or near the end of the pulse. From the graph of FIG. 3, the average power level for threshold damage by a 100 nanosecond pulse is about 750 watts, and the range of individual damage thresholds is from 500 to 1050 watts.

Thus, an important difference between the Wunsch test method and the present inventive method is the use of a constant current pulse. When constant-current pulses are used, the input power to the device is reduced when the diode voltage drops at second breakdown, and overkill damage is prevented. The degree of device parameter degradation can then be used to distinguish between true and false threshold-damage levels. The reduced breakdown voltage of a diode is a useful damage indicator, but when that diode is the emitter junction of a transistor, the degradation of common-emitter gain is more sensitive indicator of damage. Neither parameter degrades linearly with input power because of the internal redistribution of current flow and the locally increased power density during the damage process.

Obviously many modifications and variations of the present invention are possible in light of the above teachings. It is therefore to be understood that within the scope of the appended claims the invention may be practiced otherwise than as specifically described.

What is claimed as new and desired to be secured by Letters Patent of the United States is:

1. An improved method for determining the damage threshold of a semiconductor p-n junction comprising the steps of:
    applying a reverse polarity constant current pulse of less than 100 nanoseconds in duration to said p-n junction;
    measuring elapsed time from the initial application of said constant current pulse to a point at which second breakdown occurs indicated by a significant drop in breakdown voltage;
    calculating said damage threshold of said p-n junction from a time integral of said breakdown voltage over said elapsed time multiplied by said constant current level.

2. The method of claim 1 wherein said step of measuring elapsed time comprises the further steps of:
    measuring an average voltage level of said breakdown voltage over said elapsed time.

3. The method of claim 1 wherein said step of applying a reverse polarity constant current pulse comprises applying a reverse polarity constant current pulse having a magnitude sufficient to cause second breakdown towards the end of said elapsed time.

4. A method for determining the damage threshold in a semiconductor junction through second breakdown comprising the steps of;
    applying a constant current pulse to said semiconductor junction having a duration of less than 100 nanoseconds and sufficient magnitude to induce second breakdown within said duration of said pulse without causing catastrophic failure in said semiconductor junction;
    measuring the power absorbed by said semiconductor junction from a time integral of an average voltage level produced across said semiconductor junction multiplied by said constant current magnitude in response to the application of said constant current pulse measured over a time duration starting after an initial turn-on spike and ending at a point where second breakdown occurs indicated by a significant drop in said average voltage level.

5. The method set forth in claim 1 wherein said step of measuring elapsed time comprises the further steps of:
    observing the degree of damage to said junction as indicated by the degradation of a selected parameter of said semiconductor; and,
    equating said point at which said second breakdown occurs to the point at which the magnitude of the voltage of said pulse first decreases if said degree of degradation is catastrophic.

6. The method set forth in claim 2 wherein said step of measuring elapsed time comprises the further steps of:
    observing the degree of damage to said junction as indicated by the degradation of a selected parameter of said semiconductor; and,
    equating said point at which said second breakdown occurs to the point at which the magnitude of the voltage of said pulse first decreases if said degree of damage is catastrophic.

7. The method set forth in claim 5 wherein said step of observing the degree of damage to said junction comprises the step of measuring the decrease in the breakdown voltage of said semiconductor junction.

8. The method set forth in claim 5 wherein said step of observing the degree of damage to said junction comprises the step of measuring the decrease in the common-emitter gain of said semiconductor.

* * * * *